(12) United States Patent
Schaef et al.

(10) Patent No.: US 12,323,061 B2
(45) Date of Patent: Jun. 3, 2025

(54) CURRENT-BALANCE CONTROL

(71) Applicant: Intel Corporation, Santa Clara, CA (US)

(72) Inventors: Christopher Schaef, Hillsboro, OR (US); Juan Munoz Constantine, Hillsboro, OR (US); Alexander Lyakhov, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 720 days.

(21) Appl. No.: 17/485,143

(22) Filed: Sep. 24, 2021

(65) Prior Publication Data

US 2022/0014101 A1 Jan. 13, 2022

(51) Int. Cl.
*H02M 3/158* (2006.01)
*H02M 1/00* (2007.01)
*H03K 5/00* (2006.01)

(52) U.S. Cl.
CPC ....... *H02M 3/1584* (2013.01); *H02M 1/0025* (2021.05); *H03K 2005/00293* (2013.01)

(58) Field of Classification Search
CPC ............. H02M 1/0025; H02M 3/1584; H02M 3/1586; H03K 2005/00293; H03L 7/087
See application file for complete search history.

(56) References Cited

U.S. PATENT DOCUMENTS

| | | | | |
|---|---|---|---|---|
| 7,502,436 B2 * | 3/2009 | Kris | ........................ | H03K 7/08 |
| | | | | 375/376 |
| 2009/0072807 A1 * | 3/2009 | Qiu | ...................... | H02M 3/156 |
| | | | | 323/285 |
| 2013/0057239 A1 * | 3/2013 | Kalje | .................. | H02M 3/1584 |
| | | | | 323/271 |
| 2020/0321872 A1 * | 10/2020 | Upadhyaya | ........... | H02M 3/157 |
| 2020/0381998 A1 * | 12/2020 | McKenzie | ............ | G06F 1/3287 |
| 2022/0393464 A1 * | 12/2022 | Venugopal | ............ | H02M 3/285 |
| 2024/0136932 A1 * | 4/2024 | Liu | ..................... | H02M 1/0025 |

* cited by examiner

*Primary Examiner* — Fred E Finch, III

(74) *Attorney, Agent, or Firm* — Schwabe, Williamson & Wyatt, P.C.

(57) ABSTRACT

Embodiments herein relate to identifying, by phase current balancing (PCB) circuitry, an indication of whether a measured current of a pulse-width modulated (PWM) signal of a plurality of PWM signals is greater than or less than an average current of the plurality of PWM signals. Embodiments further relate to adjusting, by the PCB circuitry, a bias-value of a non-modulated edge of a duty cycle of the PWM signal. Other embodiments may be described and claimed.

17 Claims, 8 Drawing Sheets

CURRENT-BALANCE CONTROL

FIELD

The present application generally relates to the field of electronic circuits and, more specifically, to current-balance control and associated apparatuses, systems, and methods.

BACKGROUND

In circuits such as interleaved direct current (DC)/DC multiphase converters, active phase management may present a challenge. Specifically, the parallel structure of a multiphase converter such as fully-integrated voltage regulators (FIVRs) may require an accurate balancing of currents through each of the phases in order to achieve the highest possible performance. Failure to adequately balance the currents in the multiphase converter may have results such as performance degradation and reliability problems due to over-current and inductor saturation issues.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
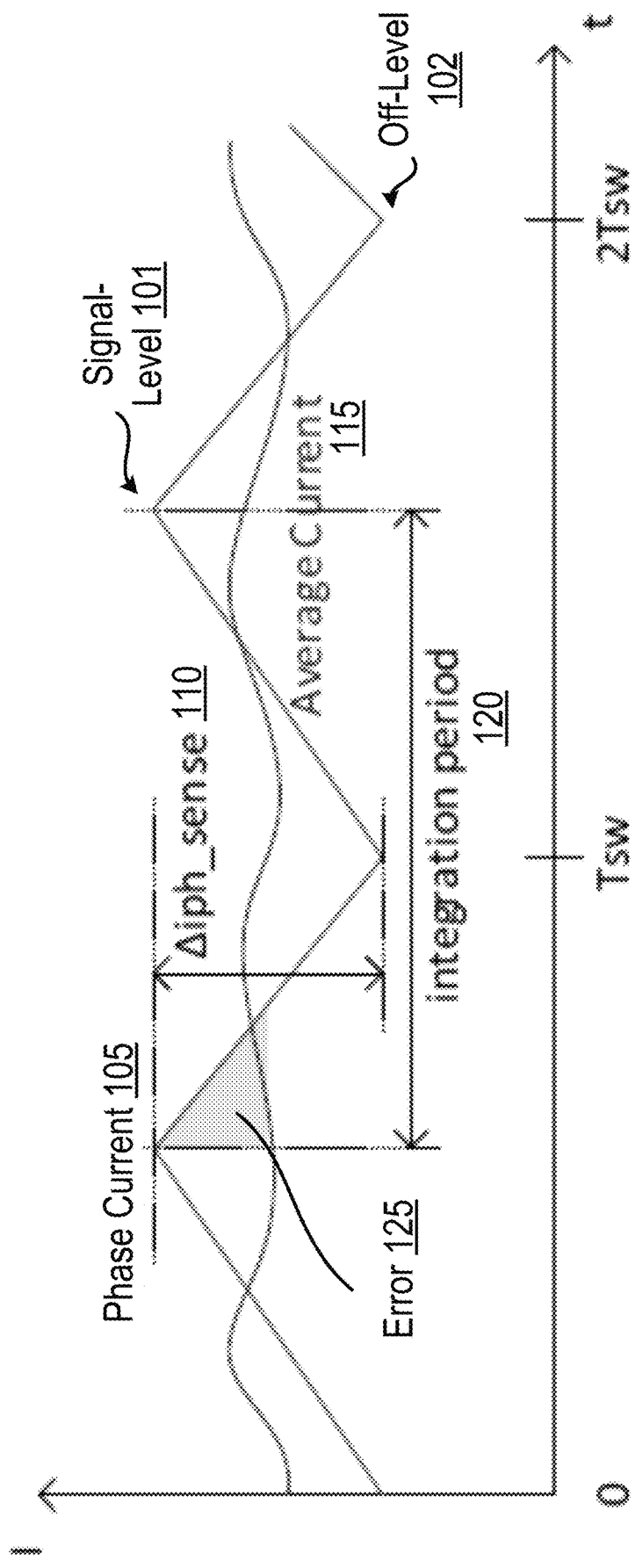
FIG. 1 illustrates an example of sensed current waveforms, in accordance with various embodiments.

In the following detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

As previously noted, failure to adequately balance the currents in the multiphase converter may have results such as performance degradation and reliability problems due to over-current and inductor saturation issues.

Generally, legacy solutions to current-balancing may have included analog solutions where the difference between the average current of a circuit and the phase current was injected, as an offset, on the triangular waves of the phase current. However, such solutions may have been disadvantageous with respect to speed or stability of the analysis/driving current loop. Other legacy solutions may have included digital solutions where current information is read by an analog-to-digital converter (ADC), and then a digital controller may modify the duty cycle based on a given algorithm. However, these solutions may require an ADC for each current phase, which may result in having up to 16 (or more) ADCs. That many ADCs may have a undesirably high footprint on the circuit.

Embodiments herein relate to a current-balancing by controlling the non-modulating edge of a pulse-width modulation (PWM) signal of a plurality of PWM signals output by a PWM. As used herein, a "PWM signal" may refer to a signal that is output by a PWM. Generally, and as explained in greater detail below with respect to FIGS. 2a and 2b, a PWM will output a plurality of signals that are out-of-phase with (e.g., orthogonal to) one another. In some embodiments, these signals may also be referred to as "phases." That is, the PWM may output a plurality of "phases." For the sake of discussion herein, the term "PWM signal" will be used for consistency.

Specifically, embodiments herein relate to logic that is configured to compare the current for a given PWM signal with respect to the average current from all active PWM signals output by a PWM. In embodiments, the current comparison may be performed by integrating the error between the average current of the active PWM signals output by a PWM and the phase current of a given PWM signal. The resulting output of this comparison may be used to adjust the duty cycle for that particular PWM signal by adding or subtracting delay on the rising (i.e., non-modulated) edge of the PWM signal. This active-duty cycle modulation may allow for accurate current balancing.

FIG. 1 illustrates an example of sensed current waveforms, in accordance with various embodiments. Specifically, FIG. 1 depicts the phase current 105 (which is illustrated as having a generally triangular waveform) for a PWM signal of a plurality of PWM signals. The phase current 105 may alternate between signal-level 101 and ground 102. The distance between peaks of the phase current 105 may correspond to the integration period 120. Logic (such as the PCB module described below) may be configured to identify the signal distance between the signal-level 101 and ground, which is represented by $\Delta$iph_sense 110. Additionally, the logic may be configured to identify an average current 115 (represented by the sinusoidal line in FIG. 1) of the plurality of PWM signals of a PWM. As described above, by integrating the error 125, which represents the total difference between the phase current 105 and the average current 115, the logic may be configured to generate a comparison between the phase current 105 and the average current 115, as described above.

Generally, the comparison may be used to identify whether the phase current 105 is generally aligned with the average current 115, or whether the phase current 105 is biased towards signal-level 101 or ground 102. If the phase current 105 is not aligned with the average current 115, for example by being biased towards signal-level 101 or ground 102, then the logic may be configured to adjust the delay of the non-modulated edge of the duty cycle to bring the phase current 105 into alignment with the average current 115, as discussed in greater detail below.

As noted, embodiments herein provide a number of advantages. For example, embodiments may help to maximize performance of a circuit such as a FIVR circuit by adequately balancing the current on respective PWM signals of a plurality of PWM signals output by a PWM. Additionally, embodiments may provide for a balancing solution that has a relatively low on-silicon footprint by avoiding complex filtering and limiting the PWM signals necessary to perform the balancing function (i.e., not creating internal balancing loops or requiring additional PWM signals). Embodiments may also avoid undesirable effects of additional phase delay, which may increase stability since the rising edge of the duty cycle is not used for PWM modulation. Finally, embodiments may allow for quick adaption to the dynamic addition or shedding of PWM signals while avoiding undesirable voltage excursions.

Figure 2A:
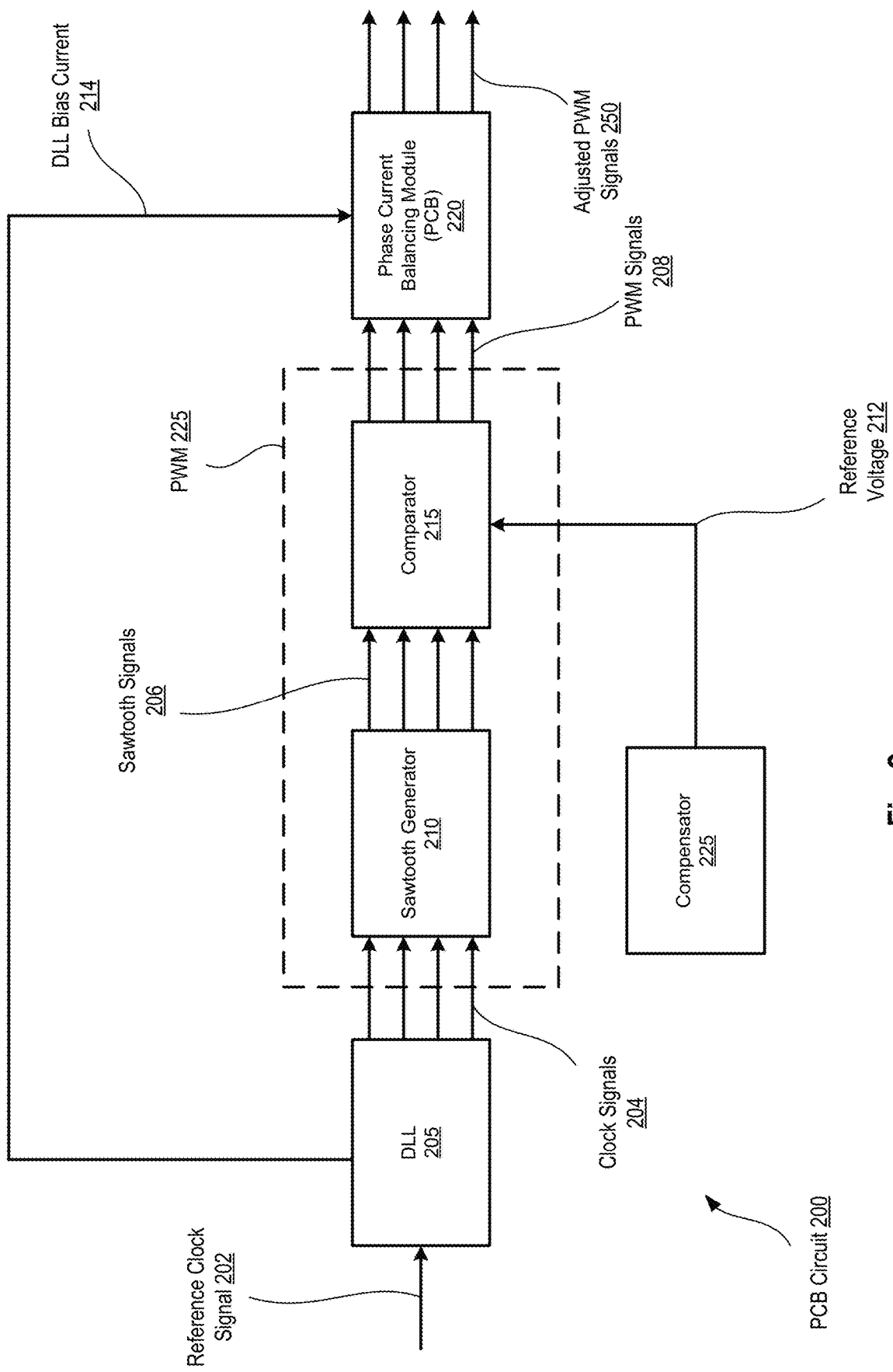
FIG. 2a illustrates a portion of an example block level diagram of a phase current balancing (PCB) circuit, in accordance with various embodiments.
Figure 2B:
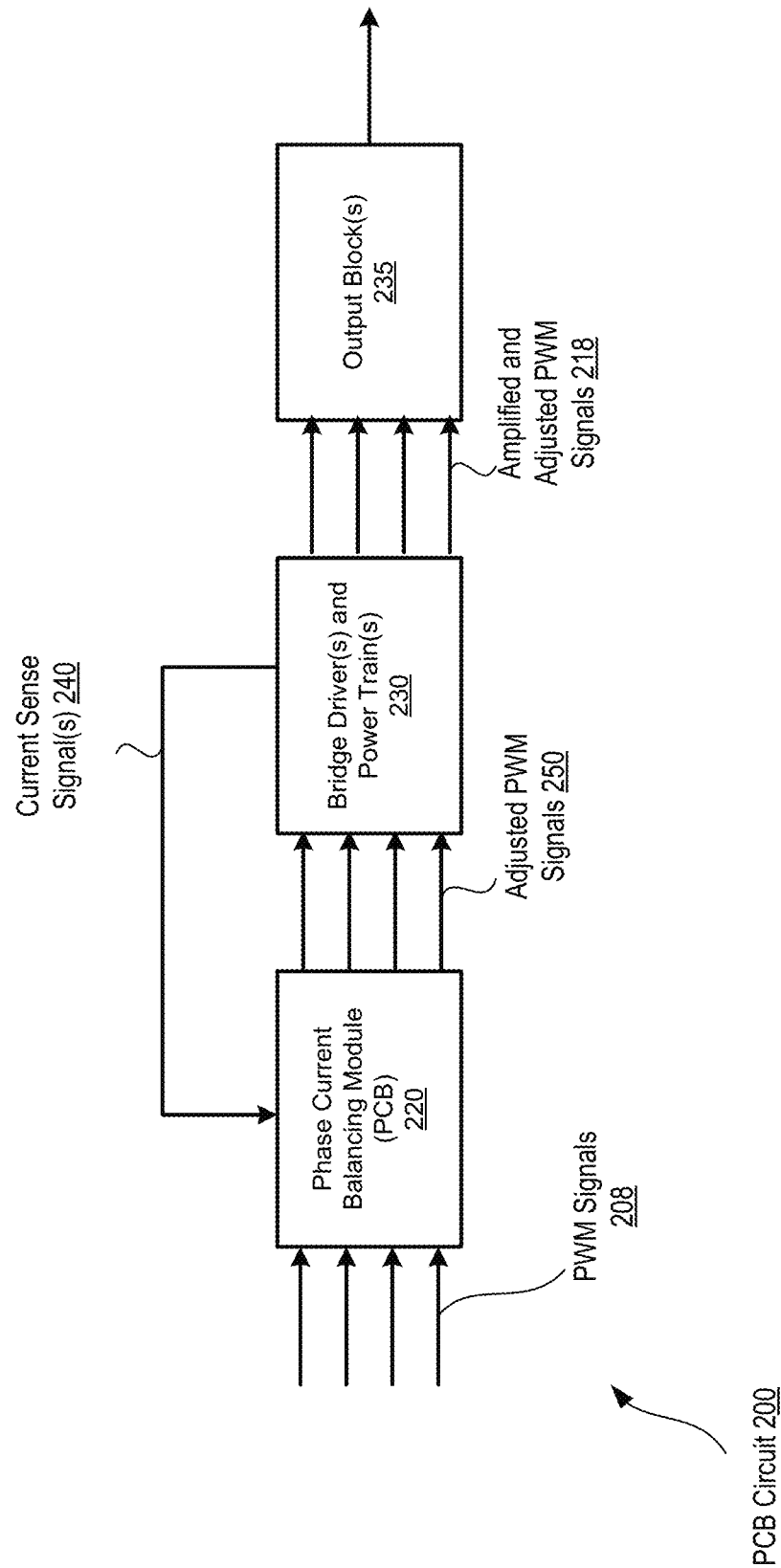
FIG. 2b illustrates another portion of the example block level diagram of the PCB circuit, in accordance with various embodiments.

FIGS. 2a and 2b (collectively, "FIG. 2") depict an example block level diagram of a PCB circuit, in accordance with various embodiments. Specifically, in embodiments, a feedback loop may be used to ensure that inductor phases in a FIVR are contributing the same amount of current to the overall current load. This current-balancing may be achieved by modulating the PWM output and, particularly, the non-modulated edge of a PWM signal. It will be understood that the depiction of FIG. 2 is intended as a high level example circuit, and real-world implementations may have more or fewer elements than are depicted in FIG. 2, elements arranged in a different order, etc.

Generally, the PCB circuit 200 accepts, as input, a reference clock signal 202. Specifically, the reference clock signal 202 provides a reference to a delay lock loop (DLL) 205. The DLL generates a plurality of clock signals 204 that are provided to a PWM 225. The clock signals 204 may be signals that are based on the timing of the reference clock signal 202. The clock signals 204 may be out-of-phase with, and orthogonal to, one another.

As shown in FIG. 2a, the DLL 205 may generate four clock signals 204, while in other embodiments the DLL 205 may generate more or fewer clock signals 204. For the sake of discussion herein, it will be assumed that the DLL 205 generates four clock signals 204, which in turn generate four sawtooth signals 206, which in turn generate four PWM signals 208.

The PWM 225 may include a sawtooth generator 210, and a comparator 215. The sawtooth generator 210 may generate, based on the clock signals, a plurality of sawtooth signals 206. That is, the sawtooth generator 210 may convert the clock signals 204 to sawtooth signals 206, which are output to the comparator 215.

The system of which the PCB circuit 200 is a part may further include a compensator 225, which is configured to provide a reference voltage 212 (which may also be referred to as VFB) to a comparator 215. The comparator 215 may compare the various sawtooth signals 206 to the reference voltage 212 to generate a plurality of PWM signals 208. Specifically, comparator 215 may compare a voltage of a sawtooth signal 206 to the reference voltage 212. For time periods at which the voltage of the sawtooth signal 206 is less than the reference voltage, the comparator 215 may set the voltage of the resultant PWM signal 208 at signal-level. For time periods at which the voltage of the sawtooth signal 206 is greater than the reference voltage, the comparator 215 may set the voltage of the resultant PWM signal 208 at ground-level. In this way, the comparator may be configured to convert a sawtooth signal 206 with a sawtooth waveform to a PWM signal 208 with a square-wave waveform. It will be understood that this description is intended as one embodiment, and in other embodiments the comparator may operate inversely, in that if the sawtooth signal 206 is greater than the reference voltage, then the resultant PWM signal 208 is set to signal level, and if the sawtooth signal 206 is less than the reference voltage, then the resultant PWM signal 208 is set to ground level.

The resultant PWM signals 208 may be output from the PWM 225 and provided to a PCB module 220 as input. The details of the PCB module are described below with respect to FIG. 3. Further, it will be noted that the DLL 205 may provide a DLL bias current 215 to the PCB module 220 as shown in FIG. 2. The PCB module 220 may then output adjusted PWM signals 250. Although four adjusted PWM signals 250 are depicted in FIG. 2a, it will be understood that in some embodiments one or more of the PWM signals 208 may be adjusted, while one or more others of the PWM signals 208 may not be adjusted. That is, in some embodiments the PCB module 220 may output both adjusted and unadjusted PWM signals 250.

The adjusted (and/or unadjusted) PWM signals 250 are provided to power-supply blocks such as one or more bridge drivers and power trains 230. The bridge drivers and power trains 230 may be configured to provide power amplification of a PWM signal to supply a combination of reactive and resistive load impedances. In some embodiments, two complimentary switching devices may be coupled with (e.g., controlled by) a single PWM signal.

The bridge driver(s) and power train(s) 230 may output one or more amplified and adjusted PWM signals 218 to one or more output blocks 235, which may include one or more inductors, capacitors, resistors, etc. and which may be used to provide a current or voltage match to the circuit to which the signals 218 are being output. In some embodiments, the bridge driver(s) and power train(s) 230 may provide one or more current sense signal(s) 240 to the PCB module 220. Specifically, the drivers/trains 230 may provide the average current of the plurality of PWM signals and the current of the PWM signal under analysis, or indications thereof. For example, the drivers/trains 230 may analyze the signals and provide data regarding the signals to the PCB module 220, or they may provide the signals in their entirety to the PCB module 220 for analysis by the PCB module 220. The specific element that analyzes the current may be based on factors such as implementation preference, components used in the circuit, etc. For example, in some embodiments the element that analyzes the currents may be a current-sense module that is separate from, but communicatively coupled with, the driver(s)/train(s) 230. Such a module may be positioned in the signal flow between the driver(s)/train(s) 230 and the output block(s) 235.

Figure 3:
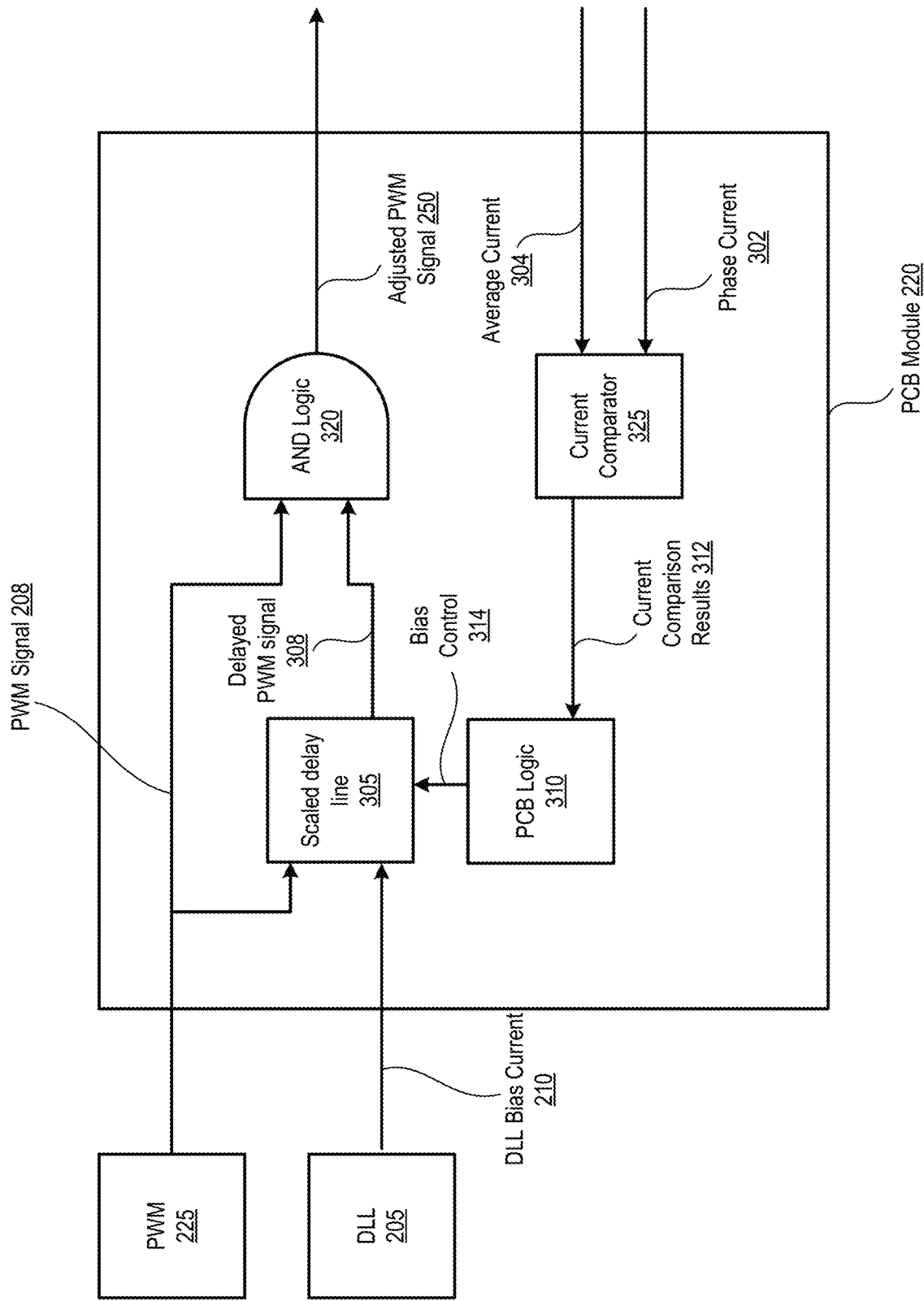
FIG. 3 illustrates an example block diagram of a PCB module, in accordance with various embodiments.

FIG. 3 illustrates an example block diagram of a PCB module such as PCB module 220, in accordance with various embodiments. Similarly to FIG. 2, it will be understood that FIG. 3 is intended as a simplified high-level example diagram, and real-world implementations may have more or fewer elements than are depicted in FIG. 3, elements arranged in a different order, etc.

The PCB module may include a scaled delay line 305 that accepts, as input, a PWM signal 208. Specifically, the scaled delay line 305 may include a number (e.g., 16, 32, or some other number) of DLL stages that may be used to generate a delayed PWM signal 308. The operation of the scaled delay line 305 is described in greater detail below.

The original PWM signal 208, as well as the delayed PWM signal 308 are provided, as input, to AND logic 320. The AND logic is configured to combine the PWM signal 208 and the delayed PWM signal 308 to adjust the non-modulated edge of the resultant adjusted PWM signal 250. Specifically, the AND operation may reduce the duty cycle of an adjusted PWM signal 250 by the delay of PWM signal 208 relative to delayed PWM signal 308 because the adjusted rising (e.g., non-modulated) edge of the adjusted PWM signal 250 may be delayed while the falling (e.g., modulated) edge of the adjusted PWM signal 250 is unaffected by the AND operation.

The PCB module further includes a current comparator 325. The current comparator 325 receives, as input, the average current 304 of the plurality of PWM signals (which may correspond to average current 115), as well as the phase current 302 of the PWM signal under analysis (which may correspond to phase current 105). The average current and the phase current 302 may be elements of the current sense signal(s) 240. As noted, in some embodiments the current comparator 325 may be configured to receive the signals themselves and measure the average current 304 and the phase current 302. In other embodiments, a separate element (e.g., a current sensor, the driver(s)/train(s) 230, or some other type of element or logic) may perform the current analysis and provide an indication of the current to the current comparator 325.

Based on the average current 304 and the phase current 302, the current comparator 325 may identify whether the phase current 302 is greater than or less than the average current 304. As noted, in some embodiments this analysis may be performed based on integrating the error between the average current 304 and the phase current 302 as described above with respect to FIG. 1. In another embodiment, this analysis may be based on subtraction of the average current 304 from an average of the phase current 302 (or vice-versa). It will be understood that these descriptions of current comparison are intended only as high-level examples, and other embodiments may use additional or alternative techniques for current comparison.

The current comparison results 312 are output to PCB logic 310. Based on the current comparison results 312, the PCB logic 310 may be configured to identify whether the phase current 302 is biased higher (e.g., toward signal-level) or lower (e.g., biased toward ground) than the average current 304. Based on the current comparison results, then the PCB logic 310 may identify whether to adjust the non-modulated edge of the duty cycle of the PWM signal and, if so, by how much. In some embodiments, the identification may be based on absolute values, such that any deviation of the phase current 302 from the average current 304 results in an adjustment. In other embodiments, some degree of error tolerance may be introduced such that the phase current 302 is not adjusted if the phase current 302 value is within a tolerance (either predetermined or dynamic) of the average current 304.

Based on this identification, the PCB logic 310 may output a bias control signal 314 to a scaled delay line module 305. As noted, the scaled delay line module 305 may include a plurality of DLL stages. Using the DLL bias current 210 and the bias control 314 as inputs, the scaled delay line module 305 may be configured to generate the delayed PWM signal 308.

As a non-limiting example of operation of the PCB logic 310 and scaled delay line 305, one may presume that the scaled delay line 305 has 16 delay elements. One may further presume that it is desired for the total delay of those elements to be approximately 10% of the PWM period. Further, one may presume that the DLL 205 has 32 delay cells, which may result in a total delay matched to the PWM period through the DLL 205. Specifically, the 32 delay cells may result in a total delay which is equal to the PWM period as is ensured by the function of the DLL 205.

In embodiments, the DLL 205 may use a plurality of current-controlled delay cells which may follow a delay function $F(I_{bias})$. $I_{bias}$ may be the DLL bias current 210, which is both used by the DLL 205 and the scaled delay line 305 as described in detail below. The specific delay function $F(I_{bias})$ may be based on a variety of factors related to the specific circuitry used in the DLL 205, the number of cells, etc., and therefore may be considered to be beyond the scope of this disclosure. The delay function may dictate the delay, dT, caused by a single cell, which may be equal to $\frac{1}{32}$ of the PWM period, $T_{period}$ (which may correspond to the duty cycle period 520 depicted in further detail below with respect to FIG. 5). More specifically, the DLL 205 may adjust $I_{bias}$ to ensure that the total delay of all 32 delay cells of the DLL 205 is equal to $T_{period}$, so each delay cell of the DLL ha a delay of $\frac{1}{32} T_{period}$.

In this example, the scaled delay line 305 may follow a function of $0.2*F(I_{bias})$. In this embodiment, dTs may indicate the delay of a cell of the scaled delay line 305, and may be equal to $\frac{1}{160}*T_{period}$. In this manner, the delay provided by an element of the scaled delay line 305 may be set as a constant fraction of $T_{period}$, and the total delay of which the scaled delay line 305 is capable may be $16*\frac{1}{160}*T_{period}=0.1*T_{period}$.

It will be understood that the above is a specific example that is based on the presumption that the DLL 205 includes 32 stages, the scaled delay line 305 includes 16 stages, and the non-modulated edge of the duty cycle may be shifted by up to 10% (e.g., $0.1*T_{period}$). As noted, in other embodiments the non-modulated edge of the duty cycle may be shifted more or less, the DLL 205 and/or the scaled delay line 305 may include more or fewer stages, etc.

Generally, as may be seen in the example above, the degree to which the non-modulated edge of the duty cycle is shifted may be based on the bias control signal 314. Specifically, the PCB logic 310 may identify, based on the current comparison results 312, the amount of delay that is to be applied to the PWM signal by the scaled delay line 305 to generate the delayed PWM signal 308. If the current comparison results 312 indicate that the phase current 302 is greater than the average current 304, then a greater amount of delay may be applied to the non-modulated edge of the duty cycle by the scaled delay line 305, which may reduce the phase current 302. Conversely, if the current comparison results 312 indicate that the phase current 302 is less than the average current 304, then less delay may be applied to the non-modulated edge of the duty cycle by the scaled delay line 305, which may increase the phase current 302.

In some embodiments, the amount of delay may be changed iteratively, in that the PCB logic 310 may only change the number of delay cells of the scaled delay line 305 that are being used by 1. In other embodiments, the PCB logic 310 may change the number of delay cells of the scaled delay line 305 that are being used by some value greater than 1. In some embodiments, that value may be dynamic, while in other embodiments the value may be a static value. In one embodiment, the PCB logic 310 may have a variety of preset intervals to choose from (e.g., 1 delay cell, 2 delay cells, or 4 delay cells) and may choose one of the preset intervals. Other embodiments may vary.

Figure 4:
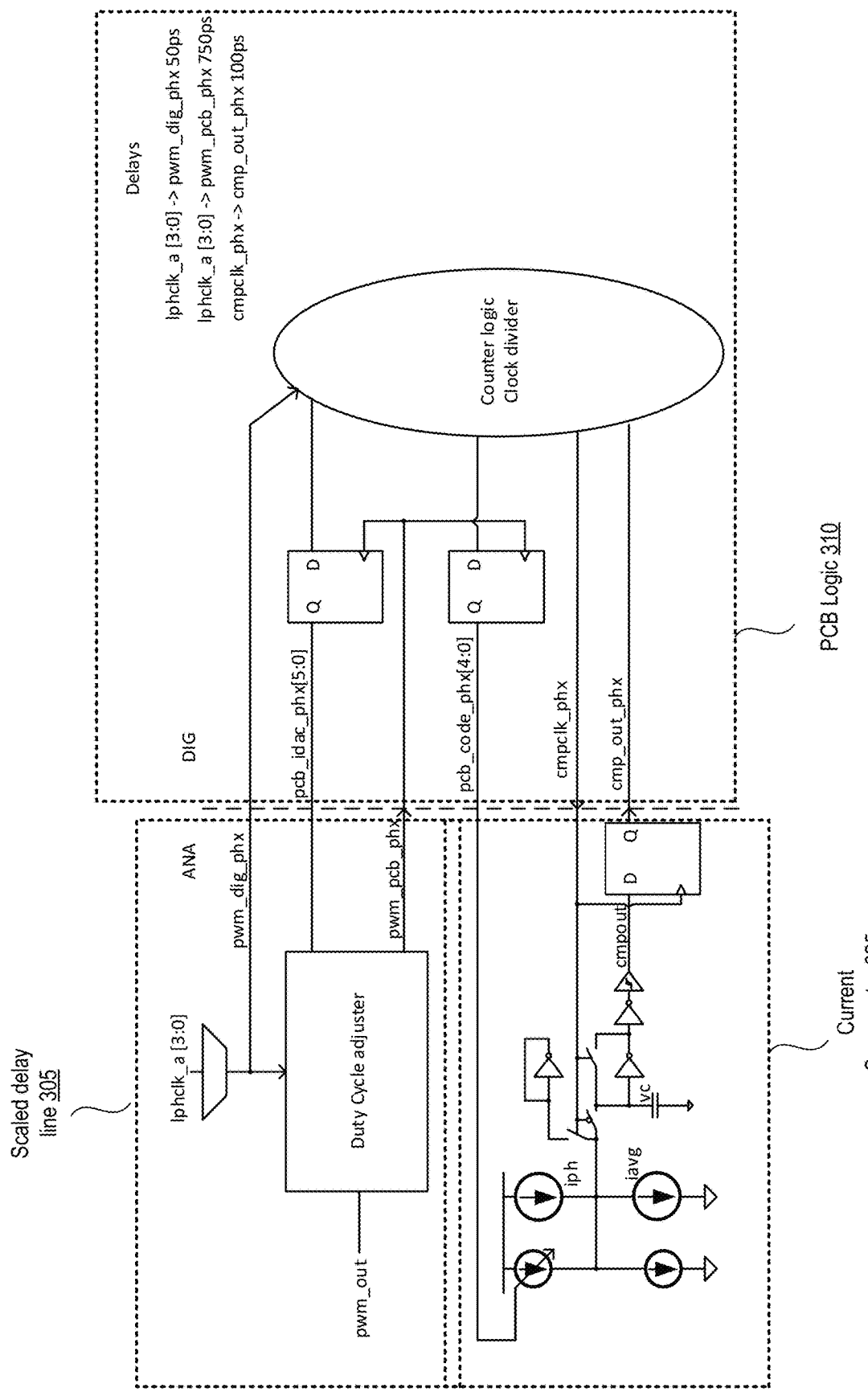
FIG. 4 illustrates example circuitry of elements of a PCB module, in accordance with various embodiments.

FIG. 4 illustrates example circuitry of elements of a PCB module, in accordance with various embodiments. Specifically, FIG. 4 illustrates example circuitry that may make up the scaled delay line 305, the PCB logic 310, and the current comparator 325. It will be understood that this circuitry is intended as one high-level example, and other embodiments may include more or fewer elements, which may be arranged in a different configuration than that depicted in FIG. 4.

The depiction of FIG. 4 may be useful in understanding how the current comparison functions, and how the PCB logic 310 identifies the parameters of the bias control 314 provided to the scaled delay line 305. Generally, comparison of the phase current 302 to the average current 304 may involve two logistically difficulties: random offset/gain variation between the phase current 302 and average current 304; and large current ripple at the switching frequency, or the existence of multiples of the switching frequency. Since the digital loop of the PCB logic 310 may use 1-bit integral control, a constant offset between the phase current 302 and the average current 304 measurements may saturate the integrator. Additionally, current ripple may add a significant time-dependent error, which may make the filtering of the current-sense signals challenging.

In order to address both issues, the current comparator 325 may integrate the current error over one PWM period as describe with respect to FIG. 1. This integration may eliminate switching frequency ripple on both phase current and average current measurements. An offset current may further be added to create a window in which the error is considered 0 and the code is kept constant.

As may be seen in FIG. 4, the current comparator 325 may operate as follows: an inverter is connected in feedback to store its own offset on a capacitor (vc). During this time a second feedback-connected inverter is connected to the current source output in order to keep the node biased correctly. Subsequently the feedback switch is opened and the current sources are connected to the capacitor. The difference in currents between the phase current 302 (indicated in FIG. 4 by iph) and the average current 304 (indicated in FIG. 4 by iavg) is therefore integrated over one PWM cycle. At the end of the cycle the comparator output is sampled.

It may be desirable for the integration capacitor of the current comparator 325 to be sized appropriately so that the current sources have sufficient headroom over the integration period. The voltage swing from current ripple can be approximated as follows:

$$\Delta vc = \frac{1}{4C} \frac{\Delta iph\_sense}{2} \frac{Tsw}{2} = \frac{\Delta iph\_sense \times Tsw}{8C}$$

Assuming a per bump peak-to-peak current ripple of 200 milliamps (mA), an effective current sense gain of 20 microamps (uA)/A and a voltage swing of 100 millivolts (mV), the capacitance can be calculated as follows:

$$C = \frac{200 \text{ mA} \times 20\frac{\mu A}{A} \times 20 \text{ ns}}{8 \times 100 \text{ mV}} = 100 fF$$

In order to keep the digital loop from saturating if there is a random offset between the phase current 302 and the average current 304, integrator leakage is introduced by adjusting the offset current based on the PCB code of the PCB logic 310. This may create a negative feedback, and limit the integrator gain.

Figure 5:
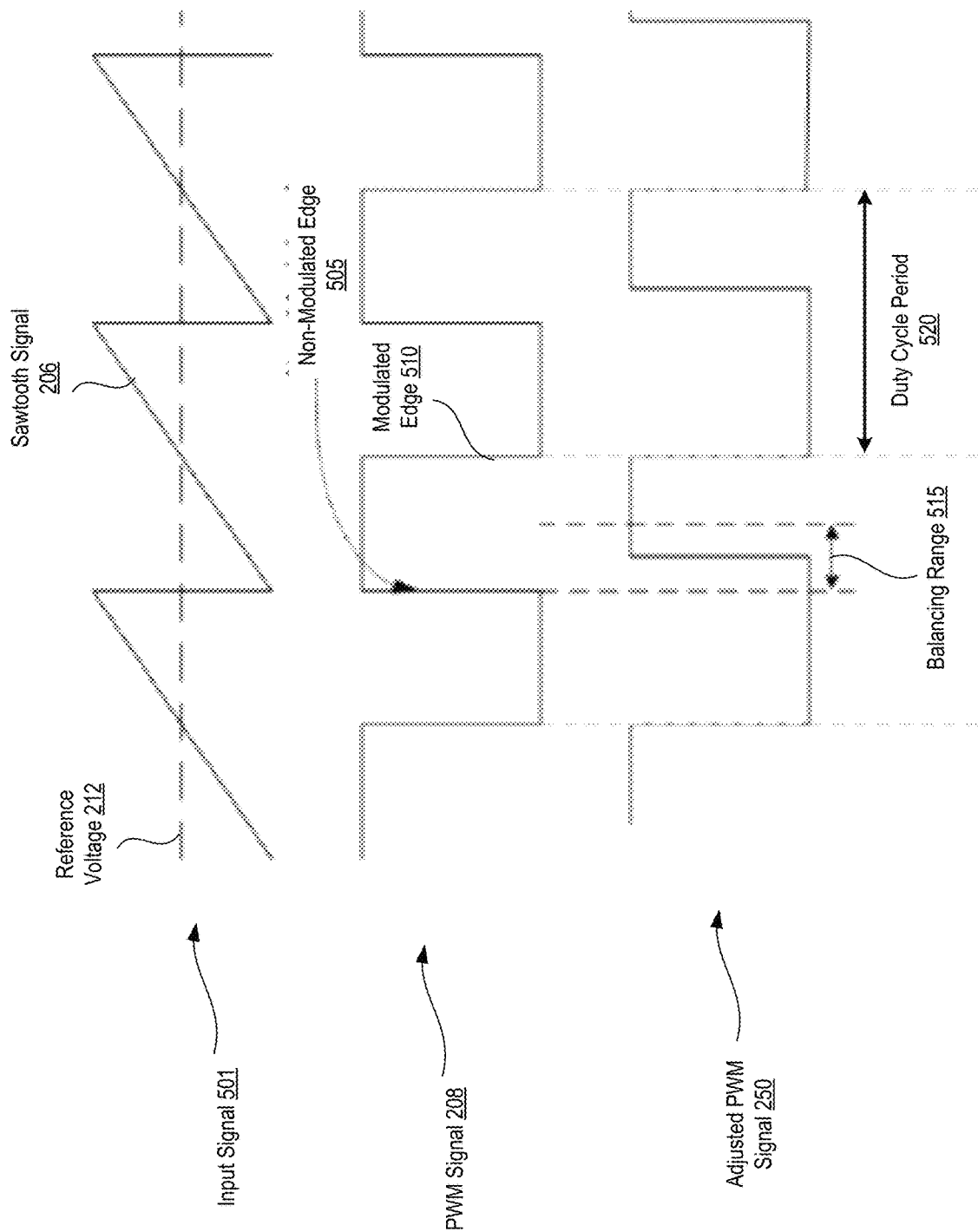
FIG. 5 illustrates an example of PWM modulation for PCB, in accordance with various embodiments.

FIG. 5 illustrates an example of PWM modulation for PCB, in accordance with various embodiments. Specifically, FIG. 5 depicts an input signal 501, an example of a PWM signal 208, and an example of an adjusted PWM signal 250.

The input signal 501 depicts an overlap of the reference voltage 212 and a sawtooth signal 206. As described above, the comparator 215 may use a sawtooth signal 206 and the reference voltage 212 to generate PWM signal 208. Specifically, it will be noted by review of FIG. 5 that portions of the input signal 501 where the sawtooth signal 206 is below the reference voltage 212 correspond to signal-level portions of the PWM signal 208, and portions of the input signal 501 where the sawtooth signal 206 is above the reference voltage 212 correspond to ground-level portions of the PWM signal 208. As noted above, in other embodiments this correspondence may be inversed such that portions of the input signal 501 where the sawtooth signal 206 is above the reference voltage 212 correspond to signal-level portions of the PWM signal 208, and portions of the input signal 501 where the sawtooth signal 206 is below the reference voltage 212 correspond to ground-level portions of the PWM signal 208.

Additionally, as noted, the PWM signal 208 includes both a modulated edge 510, and a non-modulated edge 505. Typically, the modulated edge 510 of the PWM signal may be adjusted to carry information. However, in typical legacy embodiments, the non-modulated edge 505 of the PWM signal 208 remained constant from cycle to cycle.

However, as shown at 250, in embodiments herein the non-modulated edge 505 of the adjusted PWM signal 250 may be shifted. Specifically, the non-modulated edge 505 may be adjusted within a pre-defined balancing range 515. Such a change may be referred to as a change to a bias-value of the non-modulated edge 505. In some embodiments, as discussed in the example above, the balancing range 515 may be approximately 10% of the duty cycle period 520 ($T_{period}$), while in other embodiments the balancing range may be a greater or lesser range. In some embodiments, the non-modulated edge 505 may be proactively adjusted (e.g., set to the middle of the balancing range 515) when the system is first powered up, so that there is headroom to adjust the non-modulated edge 505 both upwards and downwards. In other embodiments, the non-modulated edge 505 may not proactively adjusted.

As can be seen in FIG. 5, and as described above, shifting the non-modulated edge 505 of the adjusted PWM signal 250 may affect the proportional amount of time the signal is at signal level versus ground level. By adjusting the proportional amount of time, the measured phase current (e.g., phase current 302) may be adjusted up or down to correspond more closely to the average current 304.

While the blocks are illustrated in a particular sequence, the sequence can be modified. For example, some blocks can be performed before others, while some blocks can be performed simultaneously with other blocks. In general, the technique may be performed by the PCB module 220, and particularly elements such as the PCB logic 310, the current comparator 325, or some other embodiment. In other embodiments, the technique may be performed by additional or alternative elements, processors, logic, etc.

The technique may include setting, at 605, a bias-value of a non-modulated edge of a duty cycle of a PWM signal of a plurality of PWM signals to a value greater than 0. For example, as described above with respect to FIG. 5, the non-modulated edge of the duty cycle may be set to a value within the balancing range 515 so that there is room to iteratively move the non-modulated edge in either direction within the balancing range. However, in other embodiments it will be understood that element 605 may not be performed.

The technique may further include determining, at 610, a current of the PWM signal. For example one or more of the PCB logic 310, current comparator 325, and drivers/trains 230 may identify phase current 302. The technique may further include determining, at 615, an average current of the plurality of PWM signals. For example, one or more of the PCB logic 310, current comparator 325, and drivers/trains 230 may identify average current 304.

The technique may further include identifying, at 620, whether the current of the PWM signal is greater than or less than the average current of the plurality of PWM signals. Element 620 may be performed by current comparator 325 based on the phase current 302 and the average current 304, or by the PCB logic 310 based on the current comparison results 312. In some embodiments, the comparison may be performed by integrating the error between the phase current 302 and the average current 304 over a single integration period 120 as described above, while in other embodiments the comparison may be performed by a different element or based on different techniques or criteria (e.g., subtraction of the average of the phase current 302 from the average current 304, etc.).

The technique may further include identifying, at 625 based on whether the current of the PWM signal is greater than or less than the average current of the plurality of PWM signals, an adjustment to be made to the duty cycle. For example, as described above the PCB logic 310 may identify whether more or fewer delay cells in the scaled delay line 305 should be used to adjust the location of the non-modulated edge 505 of an adjusted PWM signal 250 within a balancing range 515. As noted, such an adjustment may be based on whether the duty cycle is biased towards signal level or ground level with respect to the average current 304.

The technique may further include adjusting, at 630 based on the identified adjustment, a bias-value of a non-modulated edge of a duty cycle of the PWM signal. For example, the PCB logic 310 may send a bias control signal 314 to the scaled delay line 305 to adjust the non-modulated edge 505 of an adjusted PWM signal 250 within the balancing range 515, as described above.

Figure 6:
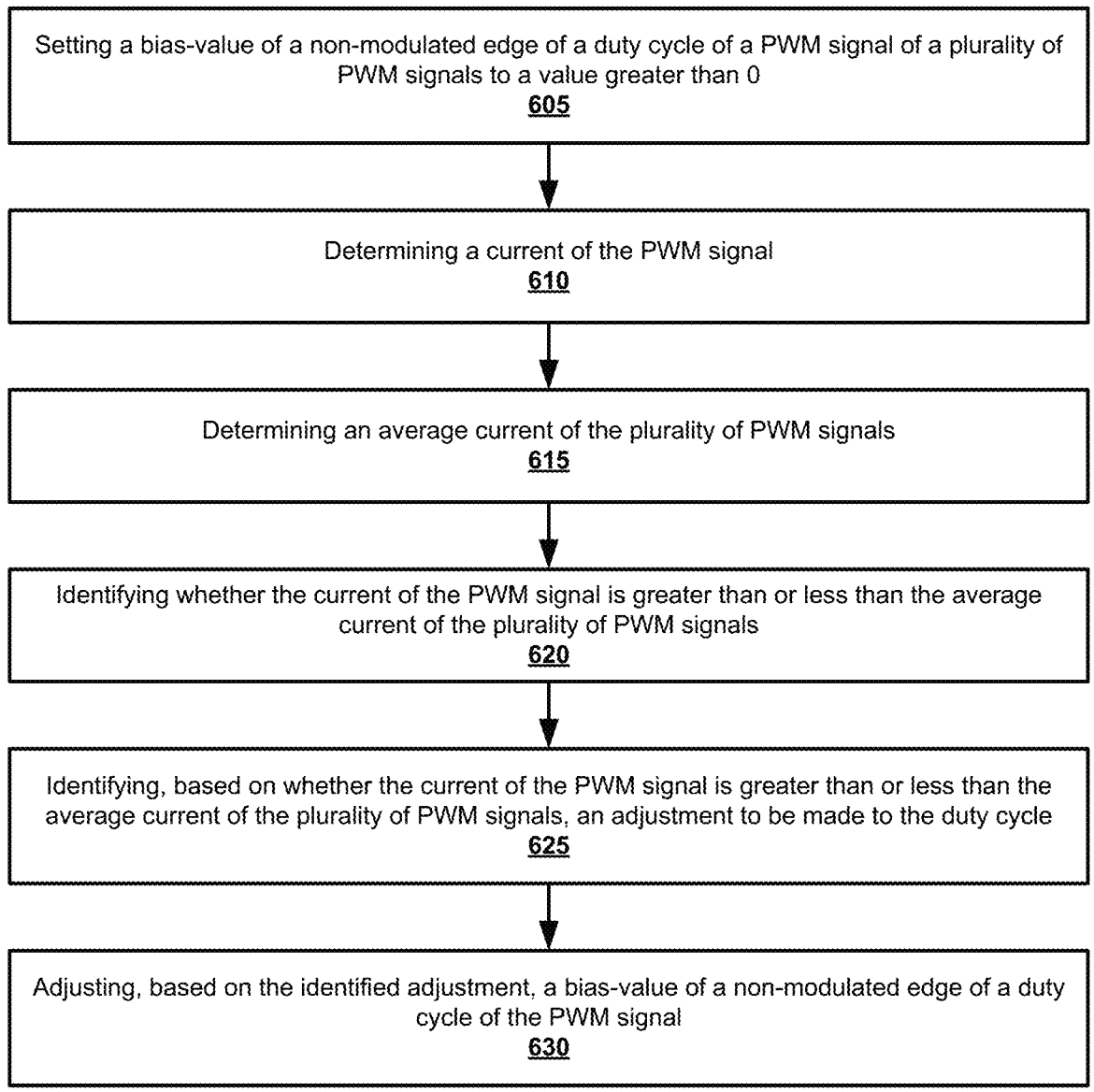
FIG. 6 illustrates an example technique for PCB, in accordance with various embodiments

The flowchart of FIG. 6 can be performed partially or wholly by software providing in a machine-readable storage medium (e.g., memory). The software is stored as computer-executable instructions (e.g., instructions to implement any other processes discussed herein). Program software code/instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions referred to as "program software code/instructions," "operating system program software code/instructions," "application program software code/instructions," or simply "software" or firmware embedded in processor. In some embodiments, the program software code/instructions associated with flowchart (and/or various embodiments) are executed by the processor system.

In some embodiments, the program software code/instructions associated with the flowchart (and/or various embodiments) are stored in a computer executable storage medium and executed by the processor. Here, the computer executable storage medium is a tangible machine readable medium that can be used to store program software code/instructions and data that, when executed by a computing device, causes one or more processors to perform a method (s) as may be recited in one or more accompanying claims directed to the disclosed subject matter.

The tangible machine-readable medium may include storage of the executable software program code/instructions and data in various tangible locations, including for example ROM, volatile RAM, non-volatile memory and/or cache and/or other tangible memory as referenced in the present application. Portions of this program software code/instructions and/or data may be stored in any one of these storage and memory devices. Further, the program software code/instructions can be obtained from other storage, including, e.g., through centralized servers or peer to peer networks and the like, including the Internet. Different portions of the software program code/instructions and data can be obtained at different times and in different communication sessions or in the same communication session.

The software program code/instructions (associated with the flowchart and other embodiments) and data can be obtained in their entirety prior to the execution of a respective software program or application by the computing device. Alternatively, portions of the software program code/instructions and data can be obtained dynamically, e.g., just in time, when needed for execution. Alternatively, some combination of these ways of obtaining the software program code/instructions and data may occur, e.g., for different applications, components, programs, objects, modules, routines or other sequences of instructions or organization of sequences of instructions, by way of example. Thus, it is not required that the data and instructions be on a tangible machine readable medium in entirety at a particular instance of time.

Examples of the tangible computer-readable media include but are not limited to recordable and non-recordable type media such as volatile and non-volatile memory devices, read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs), etc.), among others. The software program code/instructions may be temporarily stored in digital tangible communication links while implementing electrical, optical, acoustical or other forms of propagating signals, such as carrier waves, infrared signals, digital signals, etc. through such tangible communication links.

In general, tangible machine readable medium includes any tangible mechanism that provides (e.g., stores and/or transmits in digital form, e.g., data packets) information in a form accessible by a machine (e.g., a computing device), which may be included, e.g., in a communication device, a computing device, a network device, a personal digital assistant, a manufacturing tool, a mobile communication device, whether or not able to download and run applications and subsidized applications from the communication network, such as the Internet, e.g., an iPhone®, Galaxy®, Blackberry® Droid®, or the like, or any other device including a computing device. In one embodiment, processor-based system is in a form of or included within a PDA (personal digital assistant), a cellular phone, a notebook computer, a tablet, a game console, a set top box, an embedded system, a TV (television), a personal desktop computer, etc. Alternatively, the traditional communication applications and subsidized application(s) may be used in some embodiments of the disclosed subject matter.

Figure 7:
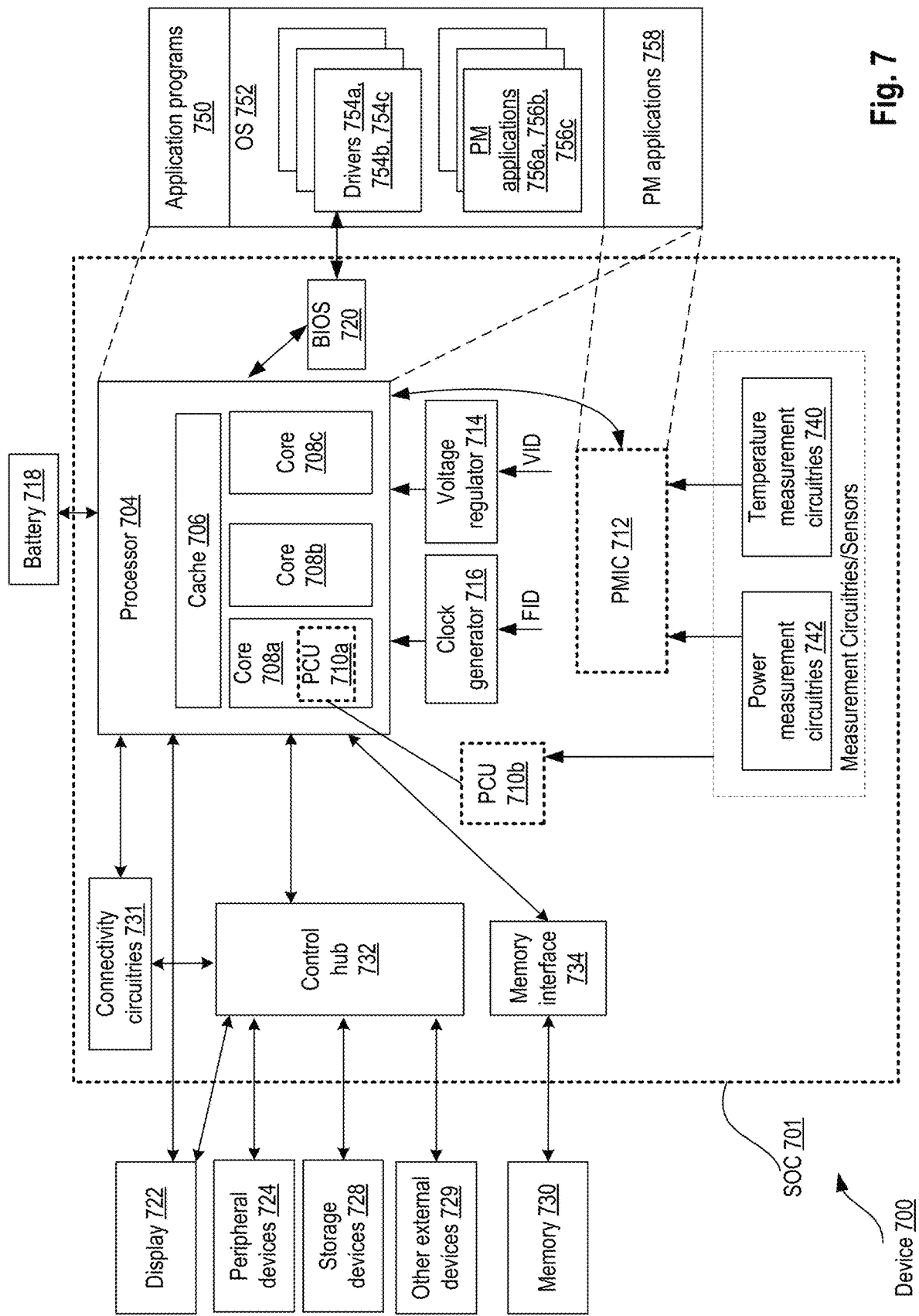
FIG. 7 illustrates a smart device or a computer system or a System-on-Chip (SoC) with apparatus and/or software for analysis or correction of duty-cycle issues, in accordance with some embodiments.

FIG. 7 illustrates a smart device or a computer system or a System-on-Chip (SoC) with apparatus and/or software for analysis or correction of duty-cycle issues, in accordance with some embodiments.

In some embodiments, device 700 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 700. The apparatus and/or software for controlling wake sources in a system to reduce power consumption in sleep state can be in the wireless connectivity circuitries 731, PCU 710, and/or other logic blocks (e.g., operating system 752) that can manage power for the computer system.

In an example, the device 700 comprises an SoC (System-on-Chip) 701. An example boundary of the SoC 701 is illustrated using dotted lines in FIG. 7, with some example components being illustrated to be included within SoC 701—however, SoC 701 may include any appropriate components of device 700.

In some embodiments, device 700 includes processor 704. Processor 704 can include one or more physical devices, such as microprocessors, application processors, microcontrollers, programmable logic devices, processing cores, or other processing means. The processing operations performed by processor 704 include the execution of an operating platform or operating system on which applications and/or device functions are executed. The processing operations include operations related to I/O (input/output) with a human user or with other devices, operations related to power management, operations related to connecting computing device 700 to another device, and/or the like. The processing operations may also include operations related to audio I/O and/or display I/O.

In some embodiments, processor 704 includes multiple processing cores (also referred to as cores) 708a, 708b, 708c. Although merely three cores 708a, 708b, 708c are illustrated in FIG. 7, processor 704 may include any other appropriate number of processing cores, e.g., tens, or even hundreds of processing cores. Processor cores 708a, 708b, 708c may be implemented on a single integrated circuit (IC) chip. Moreover, the chip may include one or more shared and/or private caches, buses or interconnections, graphics and/or memory controllers, or other components.

In some embodiments, processor 704 includes cache 706. In an example, sections of cache 706 may be dedicated to individual cores 708 (e.g., a first section of cache 706 dedicated to core 708a, a second section of cache 706 dedicated to core 708b, and so on). In an example, one or more sections of cache 706 may be shared among two or more of cores 708. Cache 706 may be split in different levels, e.g., level 1 (L1) cache, level 2 (L2) cache, level 3 (L3) cache, etc.

In some embodiments, processor core 704 may include a fetch unit to fetch instructions (including instructions with conditional branches) for execution by the core 704. The instructions may be fetched from any storage devices such as the memory 730. Processor core 704 may also include a decode unit to decode the fetched instruction. For example, the decode unit may decode the fetched instruction into a plurality of micro-operations. Processor core 704 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 704 may be an out-of-order processor core in one embodiment. Processor core 704 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 704 may also include a bus unit to enable communication between components of processor core 704 and other components via one or more buses. Processor core 704 may also include one or more registers to store data accessed by various components of the core 704 (such as values related to assigned app priorities and/or sub-system states (modes) association.

In some embodiments, device 700 comprises connectivity circuitries 731. For example, connectivity circuitries 731 includes hardware devices (e.g., wireless and/or wired connectors and communication hardware) and/or software components (e.g., drivers, protocol stacks), e.g., to enable device 700 to communicate with external devices. Device 700 may be separate from the external devices, such as other computing devices, wireless access points or base stations, etc.

In an example, connectivity circuitries 731 may include multiple different types of connectivity. To generalize, the connectivity circuitries 731 may include cellular connectivity circuitries, wireless connectivity circuitries, etc. Cellular connectivity circuitries of connectivity circuitries 731 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 731 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 731 may include a network interface, such as a wired or wireless interface, e.g., so that a system embodiment may be incorporated into a wireless device, for example, a cell phone or personal digital assistant.

In some embodiments, device 700 comprises control hub 732, which represents hardware devices and/or software components related to interaction with one or more I/O devices. For example, processor 704 may communicate with one or more of display 722, one or more peripheral devices 724, storage devices 728, one or more other external devices 729, etc., via control hub 732. Control hub 732 may be a chipset, a Platform Control Hub (PCH), and/or the like.

For example, control hub 732 illustrates one or more connection points for additional devices that connect to device 700, e.g., through which a user might interact with the system. For example, devices (e.g., devices 729) that can be attached to device 700 include microphone devices, speaker or stereo systems, audio devices, video systems or other display devices, keyboard or keypad devices, or other I/O devices for use with specific applications such as card readers or other devices.

As mentioned above, control hub 732 can interact with audio devices, display 722, etc. For example, input through a microphone or other audio device can provide input or commands for one or more applications or functions of device 700. Additionally, audio output can be provided instead of, or in addition to display output. In another example, if display 722 includes a touch screen, display 722 also acts as an input device, which can be at least partially managed by control hub 732. There can also be additional buttons or switches on computing device 700 to provide I/O functions managed by control hub 732. In one embodiment, control hub 732 manages devices such as accelerometers, cameras, light sensors or other environmental sensors, or other hardware that can be included in device 700. The input can be part of direct user interaction, as well as providing environmental input to the system to influence its operations (such as filtering for noise, adjusting displays for brightness detection, applying a flash for a camera, or other features).

In some embodiments, control hub 732 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 722 represents hardware (e.g., display devices) and software (e.g., drivers) components that provide a visual and/or tactile display for a user to interact with device 700. Display 722 may include a display interface, a display screen, and/or hardware device used to provide a display to a user. In some embodiments, display 722 includes a touch screen (or touch pad) device that provides both output and input to a user. In an example, display 722 may communicate directly with the processor 704. Display 722 can be one or more of an internal display device, as in a mobile electronic device or a laptop device or an external display device attached via a display interface (e.g., DisplayPort, etc.). In one embodiment display 722 can be a head mounted display (HMD) such as a stereoscopic display device for use in virtual reality (VR) applications or augmented reality (AR) applications.

In some embodiments, and although not illustrated in the figure, in addition to (or instead of) processor 704, device 700 may include Graphics Processing Unit (GPU) comprising one or more graphics processing cores, which may control one or more aspects of displaying contents on display 722.

Control hub 732 (or platform controller hub) may include hardware interfaces and connectors, as well as software components (e.g., drivers, protocol stacks) to make peripheral connections, e.g., to peripheral devices 724.

It will be understood that device 700 could both be a peripheral device to other computing devices, as well as have peripheral devices connected to it. Device 700 may have a "docking" connector to connect to other computing devices for purposes such as managing (e.g., downloading and/or uploading, changing, synchronizing) content on device 700. Additionally, a docking connector can allow device 700 to connect to certain peripherals that allow computing device 700 to control content output, for example, to audiovisual or other systems.

In addition to a proprietary docking connector or other proprietary connection hardware, device 700 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 731 may be coupled to control hub 732, e.g., in addition to, or instead of, being coupled directly to the processor 704. In some embodiments, display 722 may be coupled to control hub 732, e.g., in addition to, or instead of, being coupled directly to processor 704.

In some embodiments, device 700 comprises memory 730 coupled to processor 704 via memory interface 734. Memory 730 includes memory devices for storing information in device 700.

In some embodiments, memory 730 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 730 can be a dynamic random-access memory (DRAM) device, a static random-access memory (SRAM) device, flash memory device, phase-change memory device, or some other memory device having suitable performance to serve as process memory. In one embodiment, memory 730 can operate as system memory for device 700, to store data and instructions for use when the one or more processors 704 executes an application or process. Memory 730 can store application data, user data, music, photos, documents, or other data, as well as system data (whether long-term or temporary) related to the execution of the applications and functions of device 700.

Elements of various embodiments and examples are also provided as a machine-readable medium (e.g., memory 730) for storing the computer-executable instructions (e.g., instructions to implement any other processes discussed herein). The machine-readable medium (e.g., memory 730) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 700 comprises temperature measurement circuitries 740, e.g., for measuring temperature of various components of device 700. In an example, temperature measurement circuitries 740 may be embedded, or coupled or attached to various components, whose temperature are to be measured and monitored. For example, temperature measurement circuitries 740 may measure temperature of (or within) one or more cores 708a, 708b, 708c, voltage regulator 714, memory 730, a mother-board of SoC 701, and/or any appropriate component of device 700.

In some embodiments, device 700 comprises power measurement circuitries 742, e.g., for measuring power consumed by one or more components of the device 700. In an example, in addition to, or instead of, measuring power, the power measurement circuitries 742 may measure voltage and/or current. In an example, the power measurement circuitries 742 may be embedded, or coupled or attached to various components, whose power, voltage, and/or current consumption are to be measured and monitored. For example, power measurement circuitries 742 may measure power, current and/or voltage supplied by one or more voltage regulators 714, power supplied to SoC 701, power supplied to device 700, power consumed by processor 704 (or any other component) of device 700, etc.

In some embodiments, device 700 comprises one or more voltage regulator circuitries, generally referred to as voltage regulator (VR) 714. VR 714 generates signals at appropriate voltage levels, which may be supplied to operate any appropriate components of the device 700. Merely as an example, VR 714 is illustrated to be supplying signals to processor 704 of device 700. In some embodiments, VR 714 receives one or more Voltage Identification (VID) signals, and generates the voltage signal at an appropriate level, based on the VID signals. Various type of VRs may be utilized for the VR 714. For example, VR 714 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 710a/b and/or PMIC 712. In some embodiments, each core has a network of distributed LDOs to provide efficient control for power management. The LDOs can be digital, analog, or a combination of digital or analog LDOs. In some embodiments, VR 714 includes current tracking apparatus to measure current through power supply rail(s).

In some embodiments, device 700 comprises one or more clock generator circuitries, generally referred to as clock generator 716. Clock generator 716 generates clock signals at appropriate frequency levels, which may be supplied to any appropriate components of device 700. Merely as an example, clock generator 716 is illustrated to be supplying clock signals to processor 704 of device 700. In some embodiments, clock generator 716 receives one or more Frequency Identification (FID) signals, and generates the clock signals at an appropriate frequency, based on the FID signals.

In some embodiments, device 700 comprises battery 718 supplying power to various components of device 700. Merely as an example, battery 718 is illustrated to be supplying power to processor 704. Although not illustrated in the figures, device 700 may comprise a charging circuitry, e.g., to recharge the battery, based on Alternating Current (AC) power supply received from an AC adapter.

In some embodiments, device 700 comprises Power Control Unit (PCU) 710 (also referred to as Power Management Unit (PMU), Power Controller, etc.). In an example, some sections of PCU 710 may be implemented by one or more processing cores 708, and these sections of PCU 710 are symbolically illustrated using a dotted box and labelled PCU 710a. In an example, some other sections of PCU 710 may be implemented outside the processing cores 708, and these sections of PCU 710 are symbolically illustrated using a dotted box and labelled as PCU 710b. PCU 710 may implement various power management operations for device 700. PCU 710 may include hardware interfaces, hardware circuitries, connectors, registers, etc., as well as software components (e.g., drivers, protocol stacks), to implement various power management operations for device 700.

In some embodiments, device 700 comprises Power Management Integrated Circuit (PMIC) 712, e.g., to implement various power management operations for device 700. In some embodiments, PMIC 712 is a Reconfigurable Power Management ICs (RPMICs) and/or an IMVP (Intel® Mobile Voltage Positioning). In an example, the PMIC is within an IC chip separate from processor 704. The may implement various power management operations for device 700. PMIC 712 may include hardware interfaces, hardware circuitries, connectors, registers, etc., as well as software components (e.g., drivers, protocol stacks), to implement various power management operations for device 700.

In an example, device 700 comprises one or both PCU 710 or PMIC 712. In an example, any one of PCU 710 or PMIC 712 may be absent in device 700, and hence, these components are illustrated using dotted lines.

Various power management operations of device 700 may be performed by PCU 710, by PMIC 712, or by a combination of PCU 710 and PMIC 712. For example, PCU 710 and/or PMIC 712 may select a power state (e.g., P-state) for various components of device 700. For example, PCU 710 and/or PMIC 712 may select a power state (e.g., in accordance with the ACPI (Advanced Configuration and Power Interface) specification) for various components of device 700. Merely as an example, PCU 710 and/or PMIC 712 may cause various components of the device 700 to transition to a sleep state, to an active state, to an appropriate C state (e.g., CO state, or another appropriate C state, in accordance with the ACPI specification), etc. In an example, PCU 710 and/or PMIC 712 may control a voltage output by VR 714 and/or a frequency of a clock signal output by the clock generator, e.g., by outputting the VID signal and/or the FID signal, respectively. In an example, PCU 710 and/or PMIC 712 may control battery power usage, charging of battery 718, and features related to power saving operation.

The clock generator 716 can comprise a phase locked loop (PLL), frequency locked loop (FLL), or any suitable clock source. In some embodiments, each core of processor 704 has its own clock source. As such, each core can operate at a frequency independent of the frequency of operation of the other core. In some embodiments, PCU 710 and/or PMIC 712 performs adaptive or dynamic frequency scaling or adjustment. For example, clock frequency of a processor core can be increased if the core is not operating at its maximum power consumption threshold or limit. In some embodiments, PCU 710 and/or PMIC 712 determines the operating condition of each core of a processor, and opportunistically adjusts frequency and/or power supply voltage of that core without the core clocking source (e.g., PLL of that core) losing lock when the PCU 710 and/or PMIC 712 determines that the core is operating below a target performance level. For example, if a core is drawing current from a power supply rail less than a total current allocated for that core or processor 704, then PCU 710 and/or PMIC 712 can temporality increase the power draw for that core or processor 704 (e.g., by increasing clock frequency and/or power supply voltage level) so that the core or processor 704 can perform at higher performance level. As such, voltage and/or frequency can be increased temporality for processor 704 without violating product reliability.

In an example, PCU 710 and/or PMIC 712 may perform power management operations, e.g., based at least in part on receiving measurements from power measurement circuitries 742, temperature measurement circuitries 740, charge level of battery 718, and/or any other appropriate information that may be used for power management. To that end, PMIC 712 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 710 and/or PMIC 712 in at least one embodiment to allow PCU 710 and/or PMIC 712 to manage processor core energy at least in part based on value(s) detected by one or more of the sensors.

Also illustrated is an example software stack of device 700 (although not all elements of the software stack are illustrated). Merely as an example, processors 704 may execute application programs 750, Operating System 752, one or more Power Management (PM) specific application programs (e.g., generically referred to as PM applications 758), and/or the like. PM applications 758 may also be executed by the PCU 710 and/or PMIC 712. OS 752 may also include one or more PM applications 756*a*, 756*b*, 756*c*. The OS 752 may also include various drivers 754*a*, 754*b*, 754*c*, etc., some of which may be specific for power management purposes. In some embodiments, device 700 may further comprise a Basic Input/output System (BIOS) 720. BIOS 720 may communicate with OS 752 (e.g., via one or more drivers 754), communicate with processors 704, etc.

For example, one or more of PM applications 758, 756, drivers 754, BIOS 720, etc. may be used to implement power management specific tasks, e.g., to control voltage and/or frequency of various components of device 700, to control wake-up state, sleep state, and/or any other appropriate power state of various components of device 700, control battery power usage, charging of the battery 718, features related to power saving operation, etc.

In some embodiments, battery 718 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 710*a/b* has a capability to enable extra compute and telemetries resources for the runtime support of the pCode. Here pCode refers to a firmware executed by PCU 710*a/b* to manage performance of the SoC 701. For example, pCode may set frequencies and appropriate voltages for the processor. Part of the pCode are accessible via OS 752. In various embodiments, mechanisms and methods are provided that dynamically change an Energy Performance Preference (EPP) value based on workloads, user behavior, and/or system conditions. There may be a well-defined interface between OS 752 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 752 by including machine-learning support as part of OS 752 and either tuning the EPP value that the OS hints to the hardware (e.g., various components of SoC 701) by machine-learning prediction, or by delivering the machine-learning prediction to the pCode in a manner similar to that done by a Dynamic Tuning Technology (DTT) driver. In this model, OS 752 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 752 and the other from software such as DTT, and may selectively choose to provide higher performance and/or responsiveness. As part of this method, the pCode may enable in the DTT an option to tune its reaction for the DTT for different types of activity.

Some non-limiting Examples of various embodiments are presented below.

Example 1 includes one or more non-transitory computer-readable media comprising instructions that, upon execution of the instructions by one or more processor of an electronic device, are to cause the electronic device to: set a bias-value of a non-modulated edge of a duty cycle of a pulse-width modulated (PWM) signal of a plurality of PWM signals to a value greater than 0; determine a current of the PWM signal; identify, based on the current of the PWM signal and an average current of the plurality of PWM signals, an adjustment to be made to the duty cycle; and adjust, based on the adjustment, the bias-value of a non-modulated edge of the duty cycle.

Example 2 includes the one or more non-transitory computer-readable media of example 1, or some other example herein, wherein the value greater than 0 is a midpoint of a pre-identified balancing range.

Example 3 includes the one or more non-transitory computer-readable media of example 1, or some other example herein, wherein the instructions are further to adjust the non-modulated edge of the duty cycle based on a delay-lock loop (DLL) bias current.

Example 4 includes the one or more non-transitory computer-readable media of any of examples 1-3, or some other example herein, wherein the instructions are to identify the adjustment based on a determination of whether the current of the PWM signal is greater than or less than the average current of the plurality of PWM signals.

Example 5 includes the one or more non-transitory computer-readable media of example 4, or some other example herein, wherein the instructions are to adjust the bias-value by decreasing the bias-value if the current of the PWM signal is greater than the average current of the plurality of PWM signals.

Example 6 includes the one or more non-transitory computer-readable media of example 4, or some other example herein, wherein the instructions are to adjust the bias-value by increasing the bias-value if the current of the PWM signal is less than the average current of the plurality of PWM signals.

Example 7 includes the one or more non-transitory computer-readable media of any of examples 1-3, or some other example herein, wherein the PWM signal is a PWM signal of a pulse-width modulator that outputs a plurality of PWM signals that are out of phase from each other.

Example 8 includes the one or more non-transitory computer-readable media of any of examples 1-3, or some other example herein, wherein the current of the PWM signal is measured based on at least one period of a phase current of the PWM signal.

Example 9 includes phase current balancing (PCB) circuitry comprising: a current comparator to: determine a current of a pulse-width modulated (PWM) signal of a plurality of PWM signals; determine an average current of the plurality of PWM signals; and output an indication of whether the current of the PWM signal is greater than or less than the average current of the plurality of PWM signals; and PCB logic communicatively coupled with the current comparator, the PCB logic to: identify, based on the indication, an adjustment to be made to the duty cycle; and output, based on the adjustment, a bias control signal to cause an adjustment to a bias-value of a non-modulated edge of a duty cycle of the PWM signal.

Example 10 includes the PCB circuitry of example 9, or some other example herein, wherein the PCB circuitry is to adjust the non-modulated edge of the duty cycle based on a delay-lock loop (DLL) bias current.

Example 11 includes the PCB circuitry of example 9, or some other example herein, wherein the PCB circuitry is to adjust, based on the bias control signal, the bias-value by decreasing the bias-value if the current of the PWM signal is greater than the average current of the plurality of PWM signals.

Example 12 includes the PCB circuitry of example 9, or some other example herein, wherein the PCB circuitry is to adjust, based on the bias control signal, the bias-value by increasing the bias-value if the current of the PWM signal is less than the average current of the plurality of PWM signals.

Example 13 includes the PCB circuitry of any of examples 9-12, or some other example herein, wherein the PWM signal is a PWM signal of a pulse-width modulator that outputs a plurality of PWM signals that are out of phase from each other.

Example 14 includes the PCB circuitry of any of examples 9-12, or some other example herein, wherein the current of the PWM signal is measured based on at least one period of a phase current of the PWM signal.

Example 15 includes a method comprising: identifying, by phase current balancing (PCB) circuitry, an indication of whether a measured current of a pulse-width modulated (PWM) signal of a plurality of PWM signals is greater than or less than an average current of the plurality of PWM signals; and adjusting, by the PCB circuitry, a bias-value of a non-modulated edge of a duty cycle of the PWM signal.

Example 16 includes the method of example 15, or some other example herein, wherein the method further comprises setting, by the PCB circuitry, the bias-value to a value greater than 0.

Example 17 includes the method of example 16, or some other example herein, wherein the value greater than 0 is a midpoint of a pre-identified balancing range.

Example 18 includes the method of example 15, or some other example herein, wherein adjusting the bias-value of the non-modulated edge of the duty cycle is based on a delay-lock loop (DLL) bias current.

Example 19 includes the method of any of examples 15-18, or some other example herein, comprising adjusting, by the PCB circuitry, the bias-value by decreasing the bias-value if the current of the PWM signal is greater than the average current of the plurality of PWM signals.

Example 20 includes the method of any of examples 15-18, or some other example herein, comprising adjusting, by the PCB circuitry, the bias-value by increasing the bias-value if the current of the PWM signal is less than the average current of the plurality of PWM signals.

Example 21 includes the method of any of examples 15-18, or some other example herein, wherein the PWM signal is a PWM signal of a pulse-width modulator that outputs a plurality of PWM signals that are out of phase from each other.

Example 22 includes the method of any of examples 15-18, or some other example herein, wherein the current of the PWM signal is measured based on at least one period of a phase current of the PWM signal.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

The invention claimed is:

1. One or more non-transitory computer-readable media comprising instructions that, upon execution of the instructions by one or more processor of an electronic device, are to cause the electronic device to:

set a bias-value of a non-modulated edge of a duty cycle of a pulse-width modulated (PWM) signal of a plurality of PWM signals to a value greater than 0;

determine a current of the PWM signal;

identify, based on the current of the PWM signal and an average current of the plurality of PWM signals, an adjustment to be made to the duty cycle;

adjust, based on the adjustment, the bias-value of a non-modulated edge of the duty cycle; and adjust, based on a delay-lock loop (DLL) bias current, the non-modulated edge of the duty cycle.

2. The one or more non-transitory computer-readable media of claim 1, wherein the value greater than 0 is a midpoint of a pre-identified balancing range.

3. The one or more non-transitory computer-readable media of claim 1, wherein the instructions are to identify the adjustment based on a determination of whether the current of the PWM signal is greater than or less than the average current of the plurality of PWM signals.

4. The one or more non-transitory computer-readable media of claim 1, wherein the PWM signal is a PWM signal of a pulse-width modulator that outputs a plurality of PWM signals that are out of phase from each other.

5. The one or more non-transitory computer-readable media of claim 1, wherein the current of the PWM signal is measured based on at least one period of a phase current of the PWM signal.

6. Phase current balancing (PCB) circuitry comprising:

a current comparator to:

determine a current of a pulse-width modulated (PWM) signal of a plurality of PWM signals;

determine an average current of the plurality of PWM signals; and output an indication of whether the current of the PWM signal is greater than or less than the average current of the plurality of PWM signals; and PCB logic communicatively coupled with the current comparator, the PCB logic to:

identify, based on the indication, an adjustment to be made to a duty cycle; and output, based on the adjustment, a bias control signal to cause an adjustment to a bias-value of a non-modulated edge of a duty cycle of the PWM signal, wherein the PCB circuitry is to adjust the non-modulated edge of the duty cycle based on a delay-lock loop (DLL) bias current.

7. The PCB circuitry of claim 6, wherein the PCB circuitry is to adjust, based on the bias control signal, the bias-value by decreasing the bias-value if the current of the PWM signal is greater than the average current of the plurality of PWM signals.

8. The PCB circuitry of claim 6, wherein the PCB circuitry is to adjust, based on the bias control signal, the bias-value by increasing the bias-value if the current of the PWM signal is less than the average current of the plurality of PWM signals.

9. The PCB circuitry of claim 6, wherein the PWM signal is a PWM signal of a pulse-width modulator that outputs a plurality of PWM signals that are out of phase from each other.

10. The PCB circuitry of claim 6, wherein the current of the PWM signal is measured based on at least one period of a phase current of the PWM signal.

11. A method comprising:

identifying, by phase current balancing (PCB) circuitry, an indication of whether a measured current of a pulse-width modulated (PWM) signal of a plurality of PWM signals is greater than or less than an average current of the plurality of PWM signals; and adjusting, by the PCB circuitry, a bias-value of a non-modulated edge of a duty cycle of the PWM signal, wherein adjusting the bias-value of the non-modulated edge of the duty cycle is based on a delay-lock loop (DLL) bias current.

12. The method of claim 11, wherein the method further comprises setting, by the PCB circuitry, the bias-value to a value greater than 0.

13. The method of claim 12, wherein the value greater than 0 is a midpoint of a pre-identified balancing range.

14. The method of claim 11, comprising adjusting, by the PCB circuitry, the bias-value by decreasing the bias-value if the current of the PWM signal is greater than the average current of the plurality of PWM signals.

15. The method of claim 11, comprising adjusting, by the PCB circuitry, the bias-value by increasing the bias-value if the current of the PWM signal is less than the average current of the plurality of PWM signals.

16. The method of claim 11, wherein the PWM signal is a PWM signal of a pulse-width modulator that outputs a plurality of PWM signals that are out of phase from each other.

17. The method of claim 11, wherein the current of the PWM signal is measured based on at least one period of a phase current of the PWM signal.

* * * * *

UNITED STATES PATENT AND TRADEMARK OFFICE
CERTIFICATE OF CORRECTION

Page 1 of 1

PATENT NO. : 12,323,061 B2
APPLICATION NO. : 17/485143
DATED : June 3, 2025
INVENTOR(S) : Christopher Schaef, Juan Munoz Constantine and Alexander Lyakhov It is certified that error appears in the above-identified patent and that said Letters Patent is hereby corrected as shown below:

In the Claims

Column 21
Line 66 "...by one or more processor of an electronic device, are" should read --...by one or more processors of an electronic device, are--

Signed and Sealed this
Fifteenth Day of July, 2025

Coke Morgan Stewart
*Acting Director of the United States Patent and Trademark Office*